United States Patent
Kim et al.

(10) Patent No.: US 10,665,823 B2
(45) Date of Patent: May 26, 2020

(54) FLEXIBLE DISPLAY DEVICE

(71) Applicant: SAMSUNG DISPLAY CO., LTD., Yongin-si, Gyeonggi-do (KR)

(72) Inventors: Sebong Kim, Asan-si (KR); Sangjae Kim, Yongin-si (KR); Younjoon Kim, Seoul (KR); Solbi Lee, Yongin-si (KR); Gyeongho Jeong, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/782,490

(22) Filed: Oct. 12, 2017

(65) Prior Publication Data

US 2018/0102496 A1 Apr. 12, 2018

(30) Foreign Application Priority Data

Oct. 12, 2016 (KR) .................. 10-2016-0132166

(51) Int. Cl.
| | | |
|---|---|---|
| *H01L 51/52* | (2006.01) | |
| *H04M 1/02* | (2006.01) | |
| *H01L 23/552* | (2006.01) | |
| *H05K 5/00* | (2006.01) | |
| *H01L 51/00* | (2006.01) | |
| *H01L 27/32* | (2006.01) | |

(52) U.S. Cl.
CPC .......... *H01L 51/529* (2013.01); *H01L 23/552* (2013.01); *H04M 1/0268* (2013.01); *H05K 5/0017* (2013.01); *H01L 27/323* (2013.01); *H01L 51/0097* (2013.01); *H01L 51/5284* (2013.01); *H01L 2251/5338* (2013.01)

(58) Field of Classification Search
CPC ... H01L 51/529; H01L 23/552; H01L 27/323; H01L 51/0097; H01L 51/5284; H01L 2251/5338; H04M 1/0268; H05K 5/0017
USPC .......................................... 361/708
See application file for complete search history.

(56) References Cited

U.S. PATENT DOCUMENTS

| | | | |
|---|---|---|---|
| 9,123,911 B2 | 9/2015 | Kim et al. | |
| 2014/0240985 A1 | 8/2014 | Kim et al. | |
| 2014/0320762 A1* | 10/2014 | Jeong | G06F 3/041 349/12 |
| 2015/0049428 A1* | 2/2015 | Lee | G06F 1/1652 361/679.27 |
| 2015/0192961 A1* | 7/2015 | Zhou | G06F 1/1652 428/120 |
| 2015/0200375 A1 | 7/2015 | Kim et al. | |
| 2015/0207102 A1* | 7/2015 | Jeong | H01L 51/5256 257/40 |
| 2015/0313004 A1* | 10/2015 | Namkung | G06F 1/1652 361/749 |
| 2016/0099433 A1 | 4/2016 | Prushinskiy et al. | |

(Continued)

FOREIGN PATENT DOCUMENTS

| | | |
|---|---|---|
| KR | 10-2014-0085956 A | 7/2014 |
| KR | 10-2014-0127633 A | 11/2014 |
| KR | 10-2016-0082189 A | 7/2016 |

*Primary Examiner* — Jacob R Crum
(74) *Attorney, Agent, or Firm* — Innovation Counsel LLP

(57) ABSTRACT

A flexible display device includes: a display panel capable of being bent with respect to a folding line; and a metal plate disposed on the display panel and capable of being bent with respect to the folding line. The metal plate has a plurality of holes disposed on each side of the folding line, the plurality of holes being formed in a zigzag pattern with respect to the folding line.

20 Claims, 9 Drawing Sheets

(56) References Cited

U.S. PATENT DOCUMENTS

2016/0105950 A1* 4/2016 Drzaic .................. B05D 3/002
 174/251
2016/0143130 A1 5/2016 Wu et al.
2017/0062773 A1 3/2017 Lee et al.

* cited by examiner

FLEXIBLE DISPLAY DEVICE

CROSS-REFERENCE TO RELATED APPLICATION

This application claims priority under 35 U.S.C. § 119 to Korean Patent Application No. 10-2016-0132166, filed on Oct. 12, 2016, in the Korean Intellectual Property Office (KIPO), the disclosure of which is incorporated by reference herein in its entirety.

TECHNICAL FIELD

Exemplary embodiments of the present inventive concept relate to a flexible display device, and more particularly, to a flexible display device capable of distributing stress at a bending portion.

DISCUSSION OF RELATED ART

In recent times, flexible display devices that may be bent are being developed. Such a flexible display device may be used in various fields since it may be folded or bent in various shapes. In the flexible display device, a display element is disposed on a flexible substrate.

Display elements applicable to flexible display devices may include organic light emitting diodes ("OLED"), liquid crystal display ("LCD") elements, and electrophoretic display ("EPD") elements. Among these, OLED may be manufactured in a thin film-like laminated structure, and thus has excellent flexibility and is garnering attention as display elements of flexible display devices.

Flexible display devices may be classified into rollable display devices that may be rolled as a scroll, foldable display devices that may be folded as paper, and stretchable display devices that may be scaled up and down, depending on the degree of being bent.

The flexible display device may include a metal plate or a metal sheet for dissipating heat and shielding electromagnetic waves, and in such a case, a flexible metal plate or a flexible metal sheet may be used. However, in the case of using a flexible metal plate or a flexible metal sheet, a bending portion of the metal plate may be deformed due to repeated bending actions.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the present inventive concept may be directed to a flexible display device in which a metal plate or a metal sheet for dissipating heat and shielding electromagnetic waves are not deformed although a flexible display panel is bent.

According to an exemplary embodiment, a flexible display device includes: a display panel capable of being bent with respect to a folding line; and a metal plate disposed on the display panel and capable of being bent with respect to the folding line. The metal plate has a plurality of holes disposed on each side of the folding line, the plurality of holes being formed in a zigzag pattern with respect to the folding line.

Each of the plurality of holes may have an elliptical shape in a plan view.

The elliptical shape may have a major axis parallel to the folding line.

The metal plate may include: a bending portion bent with respect to the folding line; and a planar portion extending from the bending portion.

The each of the plurality of holes may be formed at a boundary between the bending portion and the planar portion.

The plurality of holes may be spaced apart from the folding line.

The plurality of holes may be spaced apart from the folding line by a distance greater than or equal to about 0.1 mm and less than or equal to about 10 mm.

The plurality of holes may include at least one group of holes disposed on one side of the folding line, each group of holes including a predetermined number of holes.

The groups of holes may be formed in a zigzag pattern with respect to an imaginary line parallel to the folding line.

The metal plate may include a high modulus material.

The metal plate may include at least one selected from the group consisting of: copper (Cu), invar, nobinite, stainless steel, and alloys thereof.

The metal plate may have a substantially same shape as a shape of the display panel in a plan view.

The flexible display device may further include a light blocking layer disposed between the display panel and the metal plate.

The flexible display device may further include a cushion layer disposed between the display panel and the metal plate.

According to another exemplary embodiment, a flexible display device includes: a metal plate capable of being bent with respect to a folding line, a display panel disposed on the metal plate and capable of being bent with respect to the folding line; and a touch sensor disposed on the display panel. The metal plate has a plurality of holes disposed on each side of the folding line, the plurality of holes being formed in a zigzag pattern with respect to the folding line.

The flexible display device may further include a polarizer disposed on the display panel.

Each of the plurality of holes may have an elliptical shape in a plan view.

The elliptical shape may have a major axis parallel to the folding line.

The plurality of holes may include at least one group of holes disposed on one side of the folding line, each group of holes including a predetermined number of holes.

The groups of holes may be formed in a zigzag pattern with respect to an imaginary line parallel to the folding line.

The foregoing is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

A more complete appreciation of the present inventive concept will become more apparent by describing in detail exemplary embodiments thereof with reference to the accompanying drawings, wherein.

DETAILED DESCRIPTION

Figure 1:
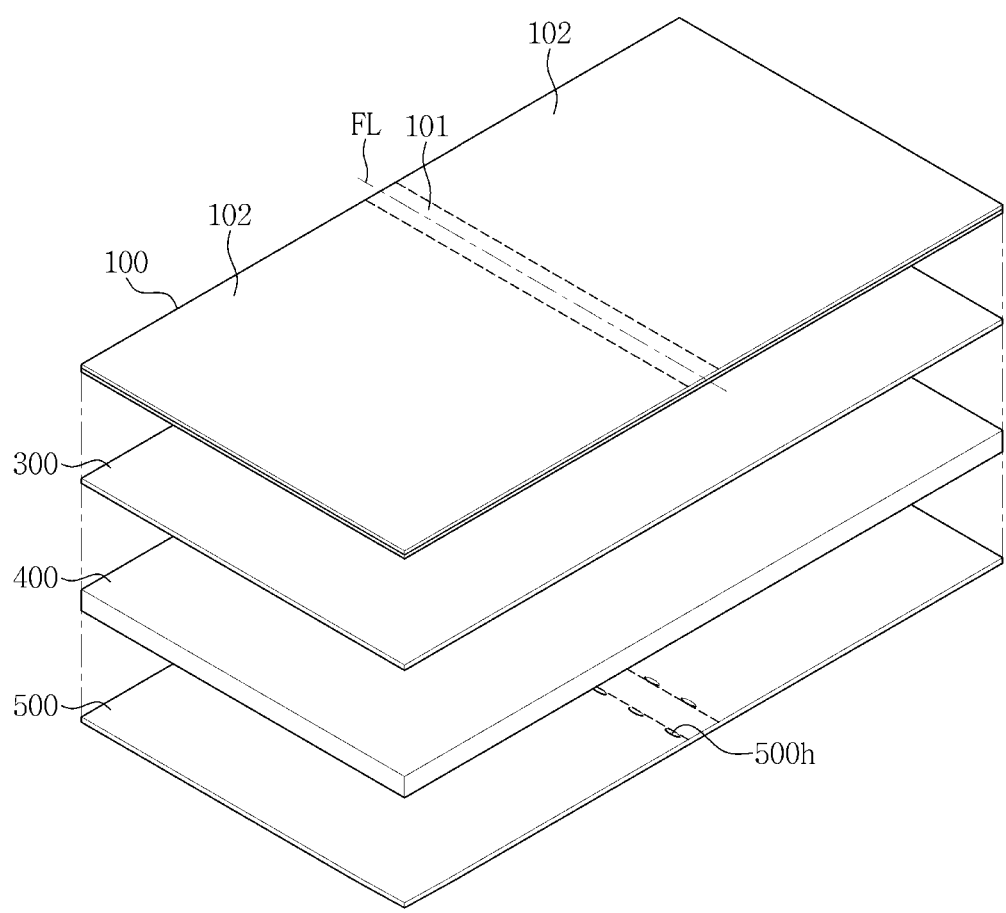
FIG. 1 is an exploded perspective view illustrating an exemplary embodiment of a flexible display device.

Exemplary embodiments will now be described more fully hereinafter with reference to the accompanying drawings. Although the inventive concept may be modified in various manners and have several exemplary embodiments, exemplary embodiments are illustrated in the accompanying drawings and will be mainly described in the specification. However, the scope of the inventive concept is not limited to the exemplary embodiments and should be construed as including all the changes, equivalents, and substitutions included in the spirit and scope of the inventive concept.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe exemplary embodiments of the present inventive concept, and like reference numerals refer to like elements throughout the specification.

Figure 2:
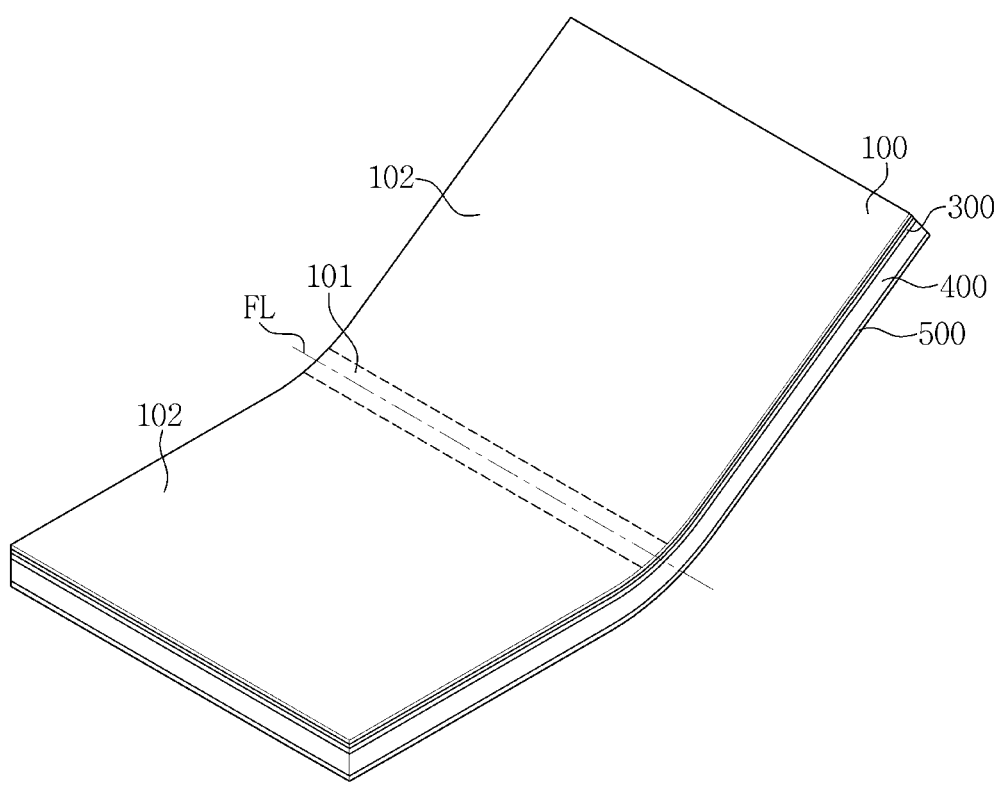
FIG. 2 is a perspective view illustrating an exemplary embodiment of the flexible display device in a folded state.

FIG. 1 is an exploded perspective view illustrating an exemplary embodiment of a flexible display device, and FIG. 2 is a perspective view illustrating an exemplary embodiment of the flexible display device in a folded state.

Referring to FIGS. 1 and 2, a flexible display device according to an exemplary embodiment includes a display panel 100, a light blocking layer 300 disposed on the display panel 100, a cushion layer 400 disposed on the light blocking layer 300, and a metal plate 500 disposed on the cushion layer 400.

However, exemplary embodiments are not limited thereto, and the flexible display device may further include a cover glass (not illustrated) disposed on the display panel 100 to face the light blocking layer 300 with the display panel 100 interposed therebetween. The cover glass includes a transparent rigid material, and thus may protect the display panel 100 from external impact while allowing an image of the display panel 100 to pass therethrough.

A touch sensor (not illustrated) may be disposed between the display panel 100 and the cover glass to detect a user's touch action. The touch sensor may be provided on a separate substrate to be disposed on the display panel 100 or may be implemented directly in the display panel 100.

In addition, a polarizer (not illustrated) may be disposed between the display panel 100 and the cover glass. The polarizer may be disposed on the display panel 100 to prevent reflection of external light.

The display panel 100 according to an exemplary embodiment may be a flexible display panel that may be bent with respect to a folding line FL.

The display panel 100 according to an exemplary embodiment may include a bending portion 101 that may be bent with respect to the folding line FL and planar portions 102 on opposite sides of the bending portion 101.

In the drawings, the display panel 100 is depicted as being bent in bilateral symmetry with respect to the folding line FL. However, exemplary embodiments are not limited thereto, and the display panel 100 may be bent in bilateral asymmetry.

Although described separately for ease of description, the bending portion 101 and the planar portion 102 of the display panel 100 may be substantially one display area. The plurality of pixels are disposed in each of the bending portion 101 and the planar portion 102 of the display panel 100 to display an image.

In addition, the display panel 100 according to an exemplary embodiment is described on the assumption that the display panel 100 is bent inwardly with respect to an area on which an image is displayed, but exemplary embodiments are not limited thereto. In one embodiment, the display panel 100 may be bent outwardly with respect to the area on which an image is displayed.

The display panel 100 may include, for example, a flexible film such as a plastic film, and may be implemented by forming an organic light emitting diode ("OLED") and a pixel circuit on the flexible film. A more detailed configuration of the display panel 100 will be described below.

The light blocking layer 300 may be disposed on a rear surface of the display panel 100. The light blocking layer 300 may block areas of the display panel 100, except an area where an image is output, from being visible to users. For example, the light blocking layer 300 may include at least one selected from the group consisting of: carbon black, a carbon nanotube, and chromium oxide ($CrO_2$). In addition, the light blocking layer 300 may include a resin or the like mixed with the aforementioned materials. Alternatively, the light blocking layer 300 may be a black tape. The materials forming the light blocking layer 300 is not limited to the above materials, and any known material capable of blocking light may be applied.

The cushion layer 400 may be disposed on the light blocking layer 300. The cushion layer 400 serves to protect the display panel 100 from an external impact. The cushion layer 400 may be attached by an adhesive, a double-sided tape or the like.

The cushion layer 400 may include a material having excellent compressive stress and excellent shock and vibration absorbency. The cushion layer 400 may include an acrylic resin, polyurethane, latex or the like, but exemplary embodiments are not limited thereto.

The metal plate 500 may be disposed on the cushion layer 400. The metal plate 500 may have a substantially same shape as that of the display panel 100 in a plan view, and may be arranged to substantially overlap the display panel 100.

Figure 3:
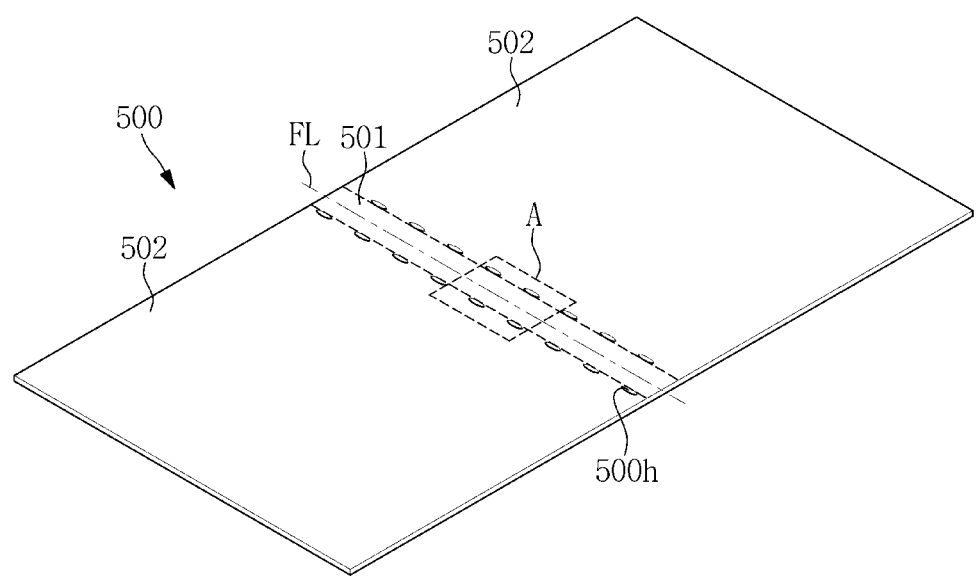
FIG. 3 is a perspective view illustrating a metal plate according to an exemplary embodiment.
Figure 4:
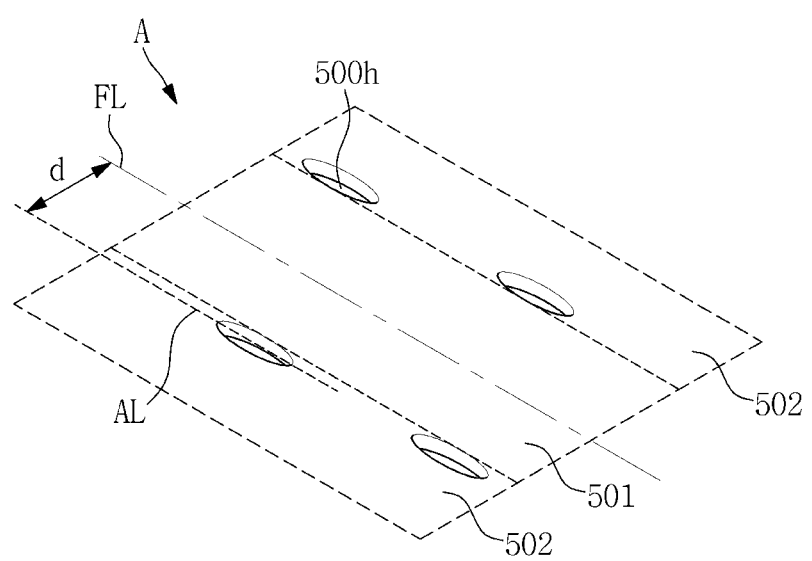
FIG. 4 is a partial enlarged view illustrating area "A" of FIG. 3.
Figure 5:
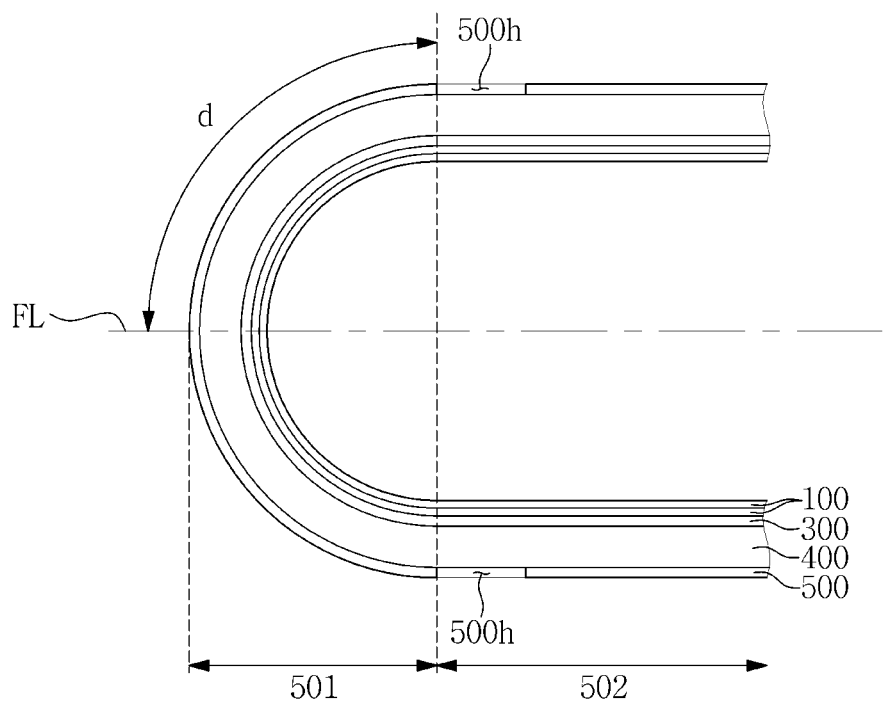
FIG. 5 is a cross-sectional view illustrating an exemplary embodiment of the flexible display device in a folded state.

FIG. 3 is a perspective view illustrating the metal plate according to an exemplary embodiment, FIG. 4 is a partial enlarged view illustrating area "A" of FIG. 3, and FIG. 5 is a cross-sectional view illustrating an exemplary embodiment of the flexible display device in a folded state.

Referring to FIGS. 3, 4 and 5, the metal plate 500 according to an exemplary embodiment protects the display panel 100 from external heat and electromagnetic waves.

The metal plate 500 may include a bending portion 501 that may be bent with respect to a folding line FL and planar portions 502 disposed on opposite sides of the bending portion 501. The bending portion 501 of the metal plate 500 may be arranged so as to substantially overlap the bending portion 101 of the display panel 100 in a plan view, and similarly, the planar portions 502 of the metal plate 500 may be arranged so as to substantially overlap the planar portions 102 of the display panel 100 in a plan view.

The metal plate 500 may include a high modulus material. For example, the metal plate 500 may include at least one selected from the group consisting of invar, nobinite, stainless steel, and alloys thereof.

As described above, since including a high modulus material, the metal plate 500 of the flexible display device according to an exemplary embodiment may not be deformed although a bending action of the display panel 100 is repeatedly performed.

In addition, the metal plate 500 according to an exemplary embodiment may have a plurality of holes 500h formed in a zigzag pattern with respect to the folding line FL. That is, in the case where the metal plate 500 is folded with respect to the folding line FL, there is no overlapping area among the plurality of holes 500h. As such, since the plurality of holes 500h are formed in a zigzag pattern with respect to the folding line FL, the compression or tensile stress generated when the metal plate 500 is bent may be easily distributed.

Further, the hole 500h according to an exemplary embodiment may have a substantially elliptic shape in a plan view, and a major axis AL which passes through a center of the hole 500h in a direction of major axis of the hole 500h may be substantially parallel to the folding line FL.

As the hole 500h has the above-described shape, that is, absent a corner, the compression or tensile stress that may be generated when the metal plate 500 is bent may be prevented from being concentrated on the corner. In addition, as the major axis AL of the hole 500h having the elliptical shape is arranged in parallel with the folding line FL, the compression or tensile stress generated around the hole 500h may be substantially minimized.

The size and number of the holes 500h may be altered according to the size of the flexible display device and physical properties of respective layers constituting the flexible display device.

In addition, the hole 500h according to an exemplary embodiment may be spaced apart from the folding line FL by a predetermined distance d. That is, a stress generated when the metal plate 500 is bent with respect to the folding line FL becomes substantially maximum at an area apart from the folding line FL by a predetermined distance d, not at an area where the folding line FL is located.

The area where the stress is substantially maximum may vary depending on the size of the flexible display device and the physical properties of the respective layers constituting the flexible display device. In general, however, the area where the stress is substantially maximum may correspond to a boundary line between the bending portion 501 and the planar portion 502. Accordingly, the hole 500h according to an exemplary embodiment may be formed at a boundary between the bending portion 501 and the planar portion 502. However, exemplary embodiments are not limited thereto, and the hole 500h may be formed at an edge portion of the planar portion 502 adjacent to the bending portion 501, or may be formed in the bending portion 501. That is, the hole 500h according to an exemplary embodiment may be formed in a region having a separation distance from the folding line FL of d which is greater than or equal to about 0.1 mm and less than or equal to about 10 mm.

That is, the hole 500h according to an exemplary embodiment is formed at an area where the stress is substantially maximum so that the compression or tensile stress generated when the metal plate 500 is bent may be easily distributed.

Figure 6:
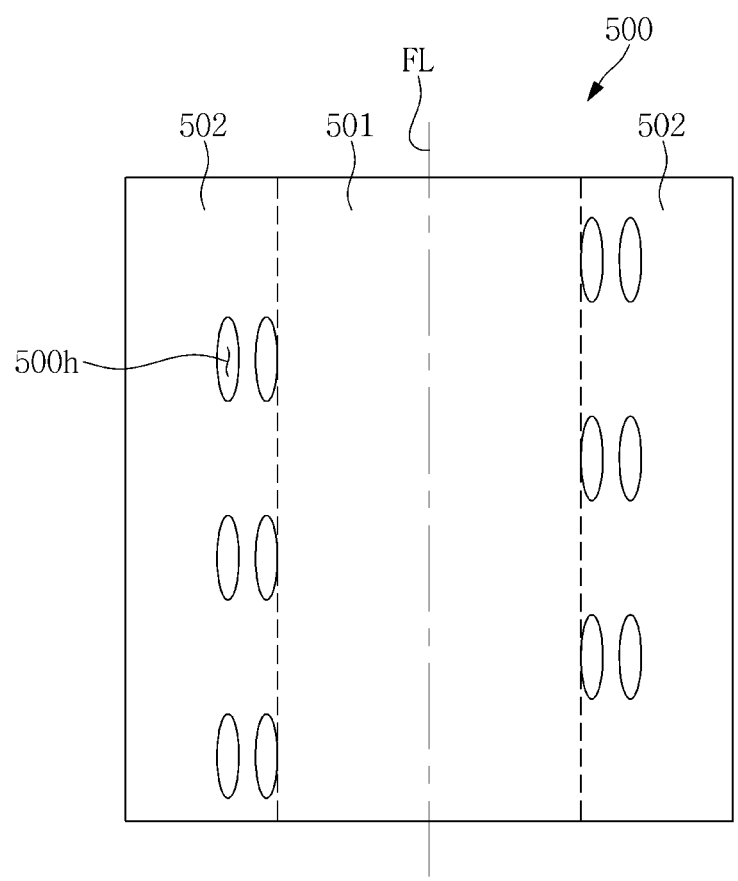
FIGS. 6 and 7 are plan views illustrating a portion of a metal plate according to an alternative exemplary embodiment.
Figure 7:
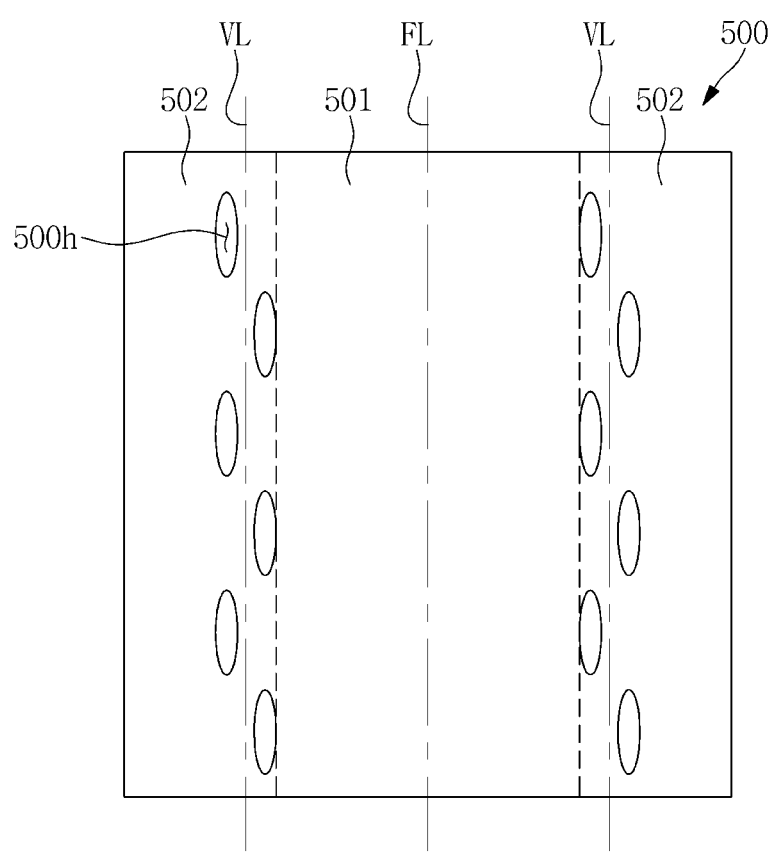

FIGS. 6 and 7 are plan views illustrating a portion of a metal plate according to an alternative exemplary embodiment. The descriptions of the metal plate according to an exemplary embodiment will be omitted from the descriptions of the metal plate according to an alternative exemplary embodiment.

Referring to FIGS. 6 and 7, the metal plate 500 according to an alternative exemplary embodiment includes a bending portion 501 that may be bent with respect to a folding line FL, and planar portions 501 disposed on opposite sides of the bending portion 501. The bending portion 501 of the metal plate 500 may be arranged so as to substantially overlap a bending portion 101 of a display panel 100 in a plan view, and similarly, the planar portions 502 of the metal plate 500 may be arranged so as to substantially overlap planar portions 102 of the display panel 100 in a plan view.

The metal plate 500 according to an alternative exemplary embodiment may have a plurality of holes 500h arranged in a zigzag pattern with respect to the folding line FL. That is, in the case where the metal plate 500 is folded with respect to the folding line FL, there is no overlapping area among the plurality of holes 500h. Further, as illustrated in FIG. 6, the plurality of holes 500h may be formed in pairs. In FIG. 6, each pair is depicted as including two holes 500h spaced apart a predetermined distance, but exemplary embodiments are not limited thereto. In one embodiment, the plurality of holes 500h may be defined in groups, each including two or more holes 500h.

In addition, as illustrated in FIG. 7, said pairs of holes 500h may be defined in a zigzag pattern with respect to an imaginary line VL parallel to the folding line FL.

As such, as the plurality of holes 500h are defined in a zigzag pattern with respect to the folding line FL, the compression or tensile stress generated when the metal plate 500 is bent may be easily distributed.

Figure 8:
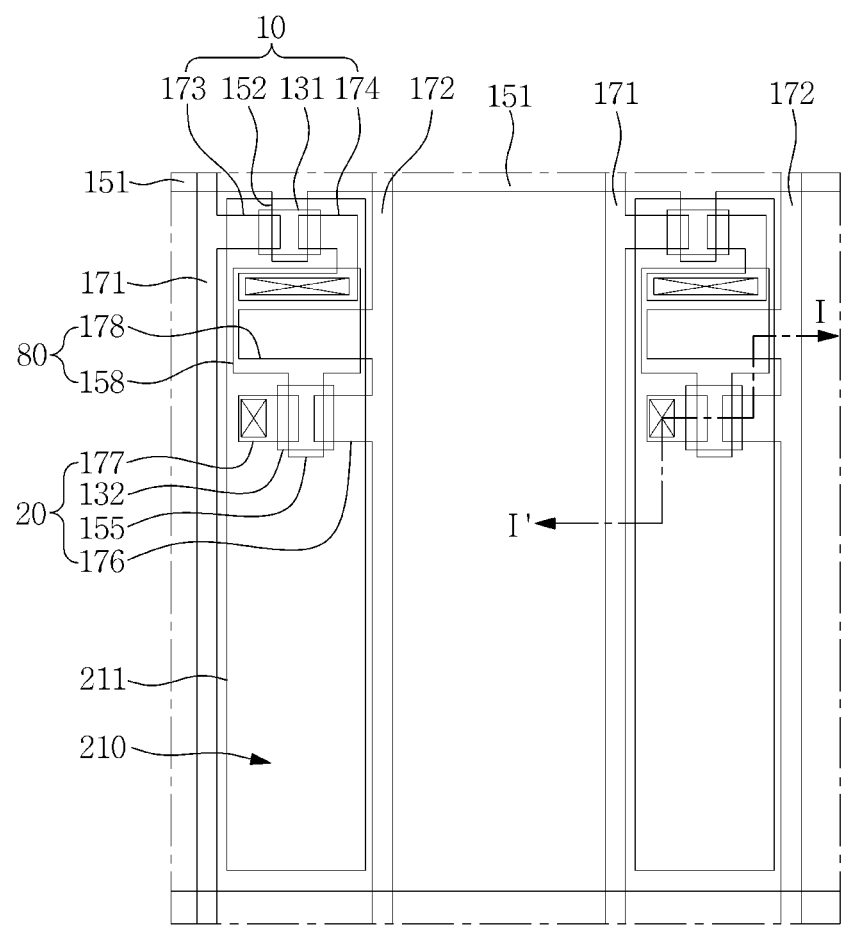
FIG. 8 is a partial enlarged view illustrating a portion of a display panel according to an exemplary embodiment.
Figure 9:
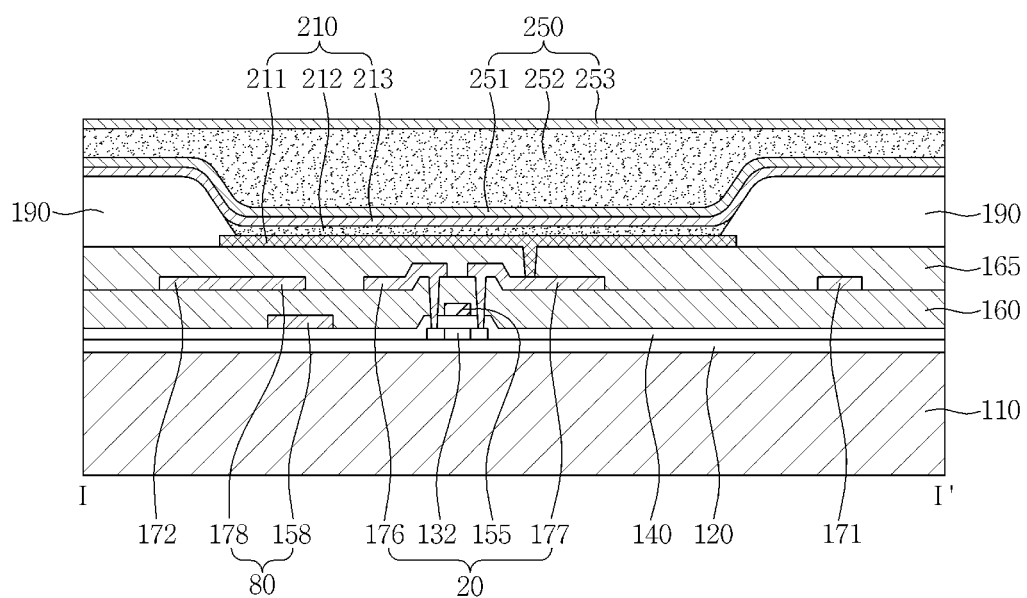
FIG. 9 is a cross-sectional view taken along line I-I' of FIG. 8.

FIG. 8 is a partial enlarged view illustrating a portion of a display panel according to an exemplary embodiment, and FIG. 9 is a cross-sectional view taken along line I-I' of FIG. 8.

Referring to FIGS. 8 and 9, the display panel 100 according to an exemplary embodiment includes a plurality of pixels including a switching thin film transistor ("TFT") 10, a driving TFT 20, a capacitor 80, and an OLED 210. The OLED 210 may be suitable to be applied to a flexible display device in that the OLED 210 may be formed thin and light, and the like. As used herein, the term "pixel" refers to a smallest unit for displaying an image, and the display panel 100 displays an image using a plurality of pixels.

Further, although each pixel is depicted in the drawings as including two TFTs and one capacitor, exemplary embodiments are not limited thereto. Each pixel may include three or more TFTs and two or more capacitors and may further include additional wirings into various structures.

The display panel 100 includes a substrate 110, a gate line 151 on the substrate 110, a data line 171 and a common power line 172 insulated from and intersecting the gate line 151. In general, each pixel may be defined by the gate line 151, the data line 171, and the common power line 172 as a boundary, but exemplary embodiments are not limited thereto. The pixels may be defined by a pixel defining layer or a black matrix.

The substrate 110 may include a flexible material. An example of the flexible material may include a plastic material. For example, the substrate 110 may include one selected from the group consisting of: kapton, polyethersulphone (PES), polycarbonate (PC), polyimide (PI), polyethyleneterephthalate (PET), polyethylene naphthalate (PEN), polyacrylate (PAR), fiber reinforced plastic (FRP), and the like.

Further, the substrate 110 may have a thickness ranging from about 5 µm to about 200 µm. In the case where the substrate 110 has a thickness of less than about 5 µm, it is difficult for the substrate 110 to stably support the OLED 210. On the other hand, in the case where the substrate 110 has a thickness of about 200 µm or more, the flexible characteristics of the substrate 110 may be degraded.

A buffer layer 120 is disposed on the substrate 110. The buffer layer 120 is configured to prevent permeation of undesirable elements into the TFT 20 and to planarize a surface therebelow, and may include suitable materials for preventing permeation and/or planarizing. For example, the buffer layer 120 may include one of the followings: a silicon nitride ($SiN_x$) layer, a silicon oxide ($SiO_2$) layer, and a silicon oxynitride ($SiO_xN_y$) layer. However, the buffer layer 120 is not invariably necessary and may be omitted based on the kinds of the substrate 110 and process conditions thereof.

A switching semiconductor layer 131 and a driving semiconductor layer 132 are disposed on the buffer layer 120. The switching semiconductor layer 131 and the driving semiconductor layer 132 may include at least one of the followings: a polycrystalline silicon layer, an amorphous silicon layer, and an oxide semiconductor including, for example, indium gallium zinc oxide (IGZO) and indium zinc tin oxide (IZTO). For example, in the case where the driving semiconductor layer 132 includes a polycrystalline silicon layer, the driving semiconductor layer 132 includes a channel area that is not doped with impurities and p+ doped source and drain areas that are formed on opposite sides of the channel area. In such an exemplary embodiment, p-type impurities, such as boron B, may be used as dopant ions and $B_2H_6$ is typically used. Such impurities may vary depending on the kinds of TFTs. The driving TFT 20 according to an exemplary embodiment uses a p-channel metal oxide semiconductor (PMOS) TFT including p-type impurities, but exemplary embodiments are not limited thereto. Alternatively, the driving TFT 20 may use an n-channel metal oxide semiconductor (NMOS) TFT or a complementary metal oxide semiconductor (CMOS) TFT.

A gate insulating layer 140 is disposed on the switching semiconductor layer 131 and the driving semiconductor layer 132. The gate insulating layer 140 may include at least one of: insulating layer formed using tetraethylorthosilicate (TEOS), silicon nitride ($SiN_x$), and silicon oxide ($SiO_2$). For example, the gate insulating layer 140 may have a double-layer structure where a $SiN_x$ layer having a thickness of about 40 nm and a TEOS insulating layer, for example, TEOS oxide, having a thickness of about 80 nm are sequentially stacked.

A gate wiring including gate electrodes 152 and 155 is disposed on the gate insulating layer 140. The gate wiring further includes the gate line 151, a first capacitor plate 158, and other lines. In addition, the gate electrodes 152 and 155 are disposed to overlap at least a portion of the semiconductor layers 131 and 132, for example, a channel area thereof. The gate electrodes 152 and 155 serve to substantially prevent the channel area from being doped with impurities when source and drain areas of the semiconductor layers 131 and 132 are doped with impurities during the process of forming the semiconductor layers 131 and 132.

The gate electrodes 152 and 155 and the first capacitor plate 158 are disposed on a substantially same layer and include a substantially same metal material. The gate electrodes 152 and 155 and the first capacitor plate 158 may include at least one of molybdenum (Mo), chromium (Cr), and tungsten (W).

An insulating interlayer 160 overlapping the gate electrodes 152 and 155 is disposed on the gate insulating layer 140. The insulating interlayer 160, similar to the gate insulating layer 140, may include or be formed of silicon nitride (SiNx), silicon oxide (SiOx), insulating layer formed using tetraethylorthosilicate (TEOS) or the like, but exemplary embodiments are not limited thereto.

A data wiring including source electrodes 173 and 176 and drain electrodes 174 and 177 is disposed on the insulating interlayer 160. The data wiring further includes the data line 171, the common power line 172, a second capacitor plate 178, and other lines. In addition, the source electrodes 173 and 176 and the drain electrodes 174 and 177 are connected to a source area and a drain area of the semiconductor layers 131 and 132, respectively, through a contact hole defined in the gate insulating layer 140 and the insulating interlayer 160.

As such, the switching TFT 10 includes the switching semiconductor layer 131, the switching gate electrode 152, the switching source electrode 173, and the switching drain electrode 174, and the driving TFT 20 includes the driving semiconductor layer 132, the driving gate electrode 155, the driving source electrode 176, and the driving drain electrode 177. Configurations of the TFTs 10 and 20 are not limited to the above embodiments, and thus may be modified into various structures that are known to and may be easily conceived by those skilled in the pertinent art.

In addition, the capacitor 80 includes the first capacitor plate 158 and the second capacitor plate 178. The insulating interlayer 160 is interposed between the first capacitor plate 158 and the second capacitor plate 178.

The switching TFT 10 may function as a switching element configured to select pixels to perform light emission. The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving TFT 20 applies, to a pixel electrode 211, a driving power which allows a light emitting layer 212 of the OLED 210 in the selected pixel to emit light. The driving gate electrode 155 is connected to the first capacitor plate 158. The driving source electrode 176 and the second capacitor plate 178 each are connected to the common power line 172. The driving drain electrode 177 is connected to the pixel electrode 211 of the OLED 210 through a contact hole.

With the aforementioned structure, the switching TFT 10 is driven by a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80, and a current corresponding to the voltage stored in the capacitor 80 flows to the OLED 210 through the driving TFT 20, such that the OLED 210 may emit light.

A planarization layer 165 is disposed to cover the data wiring, e.g., the data line 171, the common power line 172, the source electrodes 173 and 176, the drain electrodes 174 and 177, and the second capacitor plate 178, which are patterned into a substantially same layer on the insulating interlayer 160.

The planarization layer 165 serves to substantially eliminate a step difference and planarize a surface so as to increase luminance efficiency of the OLED 210 to be formed thereon. The planarization layer 165 may include at least one of the following materials: a polyacrylate resin, an epoxy resin, a phenolic resin, a polyamide resin, a polyimide resin, an unsaturated polyester resin, a polyphenylen ether resin, a polyphenylene sulfide resin, and benzocyclobutene (BCB).

The pixel electrode 211 of the OLED 210 is disposed on the planarization layer 165. The pixel electrode 211 is connected to the drain electrode 177 through a contact hole defined in the planarization layer 165.

A pixel defining layer 190 exposing at least a portion of the pixel electrode 211 to define a pixel area is disposed on the planarization layer 165. The pixel defining layer 190 may include a resin such as a polyacrylate resin and a polyimide resin.

In the pixel area, the light emitting layer 212 is disposed on the pixel electrode 211 and a common electrode 213 is disposed on the pixel defining layer 190 and the light emitting layer 212. The light emitting layer 212 includes a low molecular organic material or a high molecular organic material. At least one of a hole injection layer HIL and a hole transporting layer HTL may further be disposed between the pixel electrode 211 and the light emitting layer 212, and at least one of an electron transporting layer ETL and an electron injection layer EIL may further be disposed between the light emitting layer 212 and the common electrode 213.

The pixel electrode 211 and the common electrode 213 may be formed as one of a transmissive electrode, a transflective electrode, and a reflective electrode.

Transparent conductive oxide ("TCO") may be used to form a transmissive electrode. Such TCO may include at least one selected from the group consisting of: indium tin oxide (ITO), indium zinc oxide (IZO), zinc oxide (ZnO), or indium oxide ($In_2O_3$)

A metal, e.g., magnesium (Mg), silver (Ag), gold (Au), calcium (Ca), lithium (Li), chromium (Cr), aluminum (Al), and copper (Cu), or an alloy thereof may be used to form a transflective electrode and a reflective electrode. In such an exemplary embodiment, whether an electrode is a transflective type or a reflective type depends on the thickness of the electrode. Typically, the transflective electrode has a thickness of about 200 nm or less and the reflective electrode has a thickness of about 300 nm or more. As the thickness of the transflective electrode decreases, light transmittance and resistance increase. On the contrary, as the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

A thin film encapsulation layer 250 is disposed on the common electrode 213. The thin film encapsulation layer 250 includes one or more inorganic layers 251 and 253 and one organic layer 252. Further, the thin film encapsulation layer 250 may have a structure in which one or more inorganic layers 251 and 253 and one organic layer 252 are alternately stacked. In such an exemplary embodiment, an inorganic layer 251 is disposed at a lowermost portion. That is, the inorganic layer 251 is disposed most adjacent to the OLED 210.

The thin film encapsulation layer 250 is depicted as including two inorganic layers 251 and 253 and one organic layer 252 disposed between the two inorganic layers 251 and 253, but exemplary embodiments are not limited thereto.

The inorganic layers 251 and 253 may include one or more inorganic materials selected from the group consisting of: $Al_2O_3$, $TiO_2$, ZrO, SiNx, $SiO_2$, AlON, AN, SiON, $Si_3N_4$, ZnO, and $Ta_2O_5$. The inorganic layers 251 and 253 may be formed through methods such as a chemical vapor deposition (CVD) method or an atomic layer deposition (ALD) method. However, exemplary embodiments are not limited thereto, and the inorganic layers 251 and 253 may be formed using various methods known to those skilled in the art.

The organic layer 252 may include a polymer-based material. Examples of the polymer-based material may include, for example, an acrylic resin, an epoxy resin, polyimide, and polyethylene. In addition, the organic layer 252 may be formed through a thermal deposition process. In addition, the thermal deposition process for forming the organic layer 252 may be performed at a temperature range that may not damage the OLED 210. However, exemplary embodiments are not limited thereto, and the organic layer 252 may be formed using various methods known to those skilled in the pertinent art.

The inorganic layers 251 and 253 which have a high density of thin film may prevent or efficiently reduce permeation of, mostly, moisture or oxygen. Permeation of moisture and oxygen into the OLED 210 may be largely prevented by the inorganic layers 251 and 253.

The thin film encapsulation layer 250 may have a thickness of about 10 μm or less. Accordingly, the OLED display panel 100 may also have a significantly small thickness. By applying the thin film encapsulation layer 250 in such a manner, the OLED display panel 100 may have flexible characteristics.

As set forth hereinabove, in the flexible display device according to one or more exemplary embodiments, the metal plate for dissipating heat and shielding electromagnetic waves includes a high modulus material, such that deformation of the metal plate may be substantially prevented although a bending action is repeatedly performed.

In addition, by forming a predetermined pattern at the bending portion of the high modulus metal plate, the stress of the metal plate may be easily distributed.

While the present inventive concept has been illustrated and described with reference to the exemplary embodiments thereof, it will be apparent to those of ordinary skill in the art that various changes in form and detail may be made thereto without departing from the spirit and scope of the present inventive concept.

What is claimed is:

1. A flexible display device comprising:
a display panel capable of being bent with respect to a folding line; and
a metal plate disposed on the display panel and capable of being bent with respect to the folding line,
wherein the metal plate has a plurality of holes disposed on each side of the folding line to substantially overlap the display panel, and
1 the plurality of holes comprises:
a first plurality of holes disposed on one side of the folding line and spaced apart from the folding line at a first distance; and
a second plurality of holes disposed on the other side of the folding line and spaced apart from the folding line at the first distance, and
each of the first plurality of holes does not overlap any of the second plurality of holes when folded with respect to the folding line.

2. The flexible display device as claimed in claim 1, wherein each of the plurality of holes has an elliptical shape in a plan view.

3. The flexible display device as claimed in claim 2, wherein the elliptical shape has a major axis parallel to the folding line.

4. The flexible display device as claimed in claim 1, wherein the metal plate comprises:
a bending portion bent with respect to the folding line; and
a planar portion extending from the bending portion.

5. The flexible display device as claimed in claim 4, wherein each of the plurality of holes is formed at a boundary between the bending portion and the planar portion.

6. The flexible display device as claimed in claim 1, wherein the plurality of holes are spaced apart from the folding line.

7. The flexible display device as claimed in claim 1, wherein the plurality of holes are spaced apart from the folding line by a distance greater than or equal to about 0.1 mm and less than or equal to about 10 mm.

8. The flexible display device as claimed in claim 1, wherein the plurality of holes comprise at least one group of holes disposed on one side of the folding line, each group of holes comprising a predetermined number of holes.

9. The flexible display device as claimed in claim 8, wherein the groups of holes are formed in a zigzag pattern with respect to an imaginary line parallel to the folding line.

10. The flexible display device as claimed in claim 1, wherein the metal plate comprises a high modulus material.

11. The flexible display device as claimed in claim 1, wherein the metal plate comprises at least one selected from the group consisting of: copper (Cu), invar, nobinite, stainless steel, and alloys thereof.

12. The flexible display device as claimed in claim 1, wherein the metal plate has a substantially same shape as a shape of the display panel in a plan view.

13. The flexible display device as claimed in claim 1, further comprising a light blocking layer disposed between the display panel and the metal plate.

14. The flexible display device as claimed in claim 1, further comprising a cushion layer disposed between the display panel and the metal plate.

15. A flexible display device comprising:
a metal plate capable of being bent with respect to a folding line;
a display panel disposed on the metal plate and capable of being bent with respect to the folding line; and
a touch sensor disposed on the display panel,
wherein the metal plate has a plurality of holes disposed on each side of the folding line to substantially overlap the display panel, and
the plurality of holes comprises:
a first plurality of holes disposed on one side of the folding line and spaced apart from the folding line at a first distance; and
a second plurality of holes disposed on the other side of the folding line and spaced apart from the folding line at the first distance, and each of the first plurality of holes does not overlap any of the second plurality of holes when folded with respect to the folding line.

16. The flexible display device as claimed in claim 15, further comprising a polarizer disposed on the display panel.

17. The flexible display device as claimed in claim 15, wherein each of the plurality of holes has an elliptical shape in a plan view.

18. The flexible display device as claimed in claim 15, wherein the elliptical shape has a major axis parallel to the folding line.

19. The flexible display device as claimed in claim 15, wherein the plurality of holes comprise at least one group of holes disposed on one side of the folding line, each group of holes comprising a predetermined number of holes.

20. The flexible display device as claimed in claim 19, wherein the groups of holes are formed in a zigzag pattern with respect to an imaginary line parallel to the folding line.

* * * * *